(12) United States Patent
Tan et al.

(10) Patent No.: US 12,538,828 B2
(45) Date of Patent: Jan. 27, 2026

(54) SYSTEM AND METHOD FOR DEPOSITING UNDERFILL MATERIAL

(71) Applicant: SANDISK TECHNOLOGIES, INC., Milpitas, CA (US)

(72) Inventors: Choo Par Tan, Penang (MY); Ee May Lim, Penang (MY); Chee Ern Ng, Penang (MY)

(73) Assignee: SANDISK TECHNOLOGIES, INC., Milpitas, CA (US)

( * ) Notice: Subject to any disclaimer, the term of this patent is extended or adjusted under 35 U.S.C. 154(b) by 654 days.

(21) Appl. No.: 17/873,318

(22) Filed: Jul. 26, 2022

(65) Prior Publication Data
US 2024/0038716 A1    Feb. 1, 2024

(51) Int. Cl.
*H01L 23/00* (2006.01)
*G01B 11/06* (2006.01)
*G01B 15/02* (2006.01)

(52) U.S. Cl.
CPC .............. *H01L 24/75* (2013.01); *H01L 24/81* (2013.01); *H01L 24/83* (2013.01);
(Continued)

(58) Field of Classification Search
CPC ......... H01L 24/13; H01L 24/75; H01L 24/81; H01L 24/83; H01L 24/92; H01L 24/73; H01L 24/32; H01L 24/16; H01L 24/11; H01L 22/20; H01L 24/742; H01L 24/14; H01L 21/563; H01L 24/27; H01L 24/29; H01L 21/565; H01L 24/97; H01L 25/50; H01L 21/561; H01L 2224/83908; H01L 2224/81815; H01L 2224/8121; H01L 2924/3511; H01L 2224/16225; H01L 2224/32225; H01L 2224/75611; H01L 2224/75901; H01L 2224/73204; H01L 2224/13111; H01L 2224/131; H01L 2224/119; H01L 2224/13139; H01L 2224/1403; H01L 2224/16227;
(Continued)

(56) References Cited

U.S. PATENT DOCUMENTS 7,204,960 B2   4/2007   Hui et al.
7,622,311 B1   11/2009  Cha et al.
(Continued)

*Primary Examiner* — Mouloucoulaye Inoussa
(74) *Attorney, Agent, or Firm* — Morgan, Lewis & Bockius LLP

(57) ABSTRACT

A method of dispensing an underfill material on a semiconductor device package. A substrate having a semiconductor chip electrically connected thereto and offset from the substrate by solder joints is provided. The semiconductor chip has a footprint defined by a length and width of the semiconductor chip. Standoff heights between the substrate and the semiconductor chip are calculated and used to determine a volume of underfill material needed to substantially fill a space between the substrate and the semiconductor chip. The determined volume of underfill material is dispensed on the substrate such that the space between the substrate and the semiconductor chip is substantially filled by the underfill material. The method may allow for improved dispensing an underfill material to substantially fill the space between the substrate and semiconductor chip when variations in standoff height are present.

17 Claims, 5 Drawing Sheets

(52) U.S. Cl.
CPC .......... *G01B 11/0608* (2013.01); *G01B 15/02* (2013.01); *H01L 24/16* (2013.01); *H01L 24/32* (2013.01); *H01L 24/73* (2013.01); *H01L 2224/16225* (2013.01); *H01L 2224/32225* (2013.01); *H01L 2224/73204* (2013.01); *H01L 2224/75611* (2013.01); *H01L 2224/75901* (2013.01); *H01L 2224/8121* (2013.01); *H01L 2224/81815* (2013.01); *H01L 2224/83908* (2013.01); *H01L 2924/3511* (2013.01)

(58) Field of Classification Search
CPC . H01L 2224/32057; H01L 2224/29027; H01L 2224/97; H01L 2224/83986; H01L 2224/13082; H01L 2224/32104; H01L 2224/92125; G01B 11/0608; G01B 15/02; H05K 13/0465; H05K 13/083; H05K 3/3478; H05K 3/3436; H05K 2203/082; H05K 2203/041; H05K 2203/163; H05K 2203/176; B23K 1/0016; B23K 3/08; B23K 3/047; B23K 3/0638; B23K 1/0056; B23K 1/0008; B23K 31/12; B23K 1/008; B23K 3/0623
See application file for complete search history.

(56) References Cited

U.S. PATENT DOCUMENTS

| | | | |
|---|---|---|---|
| 7,989,965 B2 | 8/2011 | Manikam et al. | |
| 11,355,361 B1* | 6/2022 | Liang | .............. H01L 21/563 |
| 2007/0096327 A1* | 5/2007 | Kawamura | ....... H01L 23/49816 |
| | | | 257/E23.068 |
| 2010/0143656 A1* | 6/2010 | Zu | ........... H05K 3/3485 |
| | | | 228/103 |
| 2013/0087909 A1* | 4/2013 | Abdul Razak | .......... H01L 24/14 |
| | | | 257/737 |
| 2013/0200529 A1* | 8/2013 | Lin | ............. H01L 23/18 |
| | | | 257/E23.116 |
| 2013/0244346 A1* | 9/2013 | Wang | ............ H01L 25/0652 |
| | | | 257/E21.527 |
| 2013/0344627 A1* | 12/2013 | Kim | ........... H01L 25/0657 |
| | | | 438/107 |
| 2014/0091457 A1* | 4/2014 | Jiang | ............ H01L 23/49811 |
| | | | 257/772 |
| 2014/0306343 A1* | 10/2014 | Huang | ............ H01L 22/20 |
| | | | 257/738 |
| 2014/0356986 A1* | 12/2014 | Clore | ............. G06F 30/398 |
| | | | 716/112 |
| 2015/0054178 A1* | 2/2015 | Ishii | ........... H01L 24/13 |
| | | | 257/778 |
| 2016/0276177 A1* | 9/2016 | Zhang | ............. H01L 24/29 |
| 2017/0011973 A1* | 1/2017 | Tingay | ............... G01N 23/04 |
| 2017/0278816 A1* | 9/2017 | Li | .............. H01L 24/11 |
| 2018/0005972 A1* | 1/2018 | Hossain | ............. H01L 23/50 |
| 2019/0096783 A1* | 3/2019 | Yu | ............ H01L 21/4871 |
| 2021/0057517 A1* | 2/2021 | Chen | ............. H10D 1/692 |
| 2021/0210371 A1* | 7/2021 | Chen | ............. H01L 24/83 |
| 2022/0042795 A1* | 2/2022 | Peterson | ............. H01L 22/20 |
| 2022/0059444 A1* | 2/2022 | Kim | ............ H01L 23/49822 |
| 2022/0195177 A1* | 6/2022 | Sanada | ............. C08G 59/38 |
| 2022/0278151 A1* | 9/2022 | Luan | ............ H10F 39/806 |
| 2022/0322540 A1* | 10/2022 | Doyle | ............... B23K 1/0008 |
| 2023/0059410 A1* | 2/2023 | Llinas | ............. G01N 21/956 |
| 2024/0222302 A1* | 7/2024 | Kotler | ............ H05K 13/0465 |

* cited by examiner

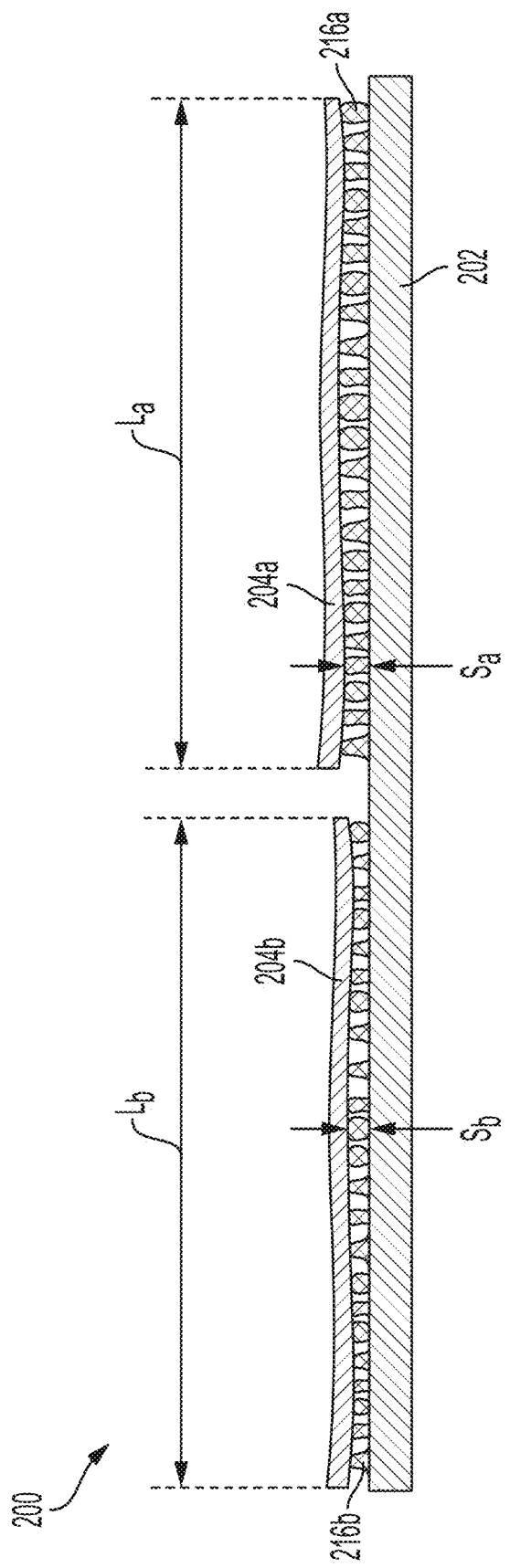

SYSTEM AND METHOD FOR DEPOSITING UNDERFILL MATERIAL

BACKGROUND

The present disclosure generally relates to semiconductor device packaging and methods and, more particularly, to systems and methods for dispensing underfill material on a semiconductor device package.

Semiconductor device package assembly includes mounting semiconductor devices (e.g., semiconductor dies or chips) and other electrical components on a substrate (e.g., a printed circuit board (PCB)) using solder paste that is deposited at predetermined locations along the substrate. The substrate and semiconductor chips mounted thereto are placed inside a reflow oven causing the solder paste to melt and form permanent solder joints between the substrate and semiconductor chips. Underfill material is dispensed to cover the solder joints and fill the space between the semiconductor chips and substrate. In recent years, the demand for reducing the carbon footprint in assembly processes such as these has increased. In response to the increasing demand for a reduction in the carbon footprint, low temperature soldering (LTS) processes involving the use of solder pastes having lower reflow temperatures have increased. While LTS processes reduce the carbon footprint when compared to conventional processes because of lower energy requirements, the reliability of the solder joints formed has decreased due to variations in the standoff height between the substrate and the semiconductor chips. Variations in the standoff height, which may occur in conventional processes but happen more frequently due to the use of low temperature solder paste, results in an increased difficulty in achieving the desired coverage of the solder joints with the underfill material. For instance, when the standoff height is greater than expected, the dispensed volume of underfill material may be insufficient to fill all of the space between the substrate and the semiconductor chip resulting in voids or gaps in the underfill. For example, variation in the standoff height may be caused by 1) partial solder collapse of non-LTS ball grid arrays (BGAs), variable diffusion rates of the LTS solder joints, and/or variations of the LTS paste released from a stencil. Therefore, there is a need to provide a system and/or method of dispensing an underfill material to achieve the desired coverage when there are variations in the standoff height.

SUMMARY

In one embodiment there is a method of dispensing an underfill material on a semiconductor device package, the method includes providing a substrate having at least one semiconductor chip electrically connected thereto and offset from the substrate by a plurality of solder joints, each semiconductor chip of the at least one semiconductor chip having a footprint defined by a length and width of the semiconductor chip, calculating at least one standoff height between the substrate and the at least one semiconductor chip, determining, based on the calculated at least one standoff height, a volume of underfill material needed to substantially fill a space between the substrate and the at least one semiconductor chip defined by the footprint of the at least one semiconductor chip and the calculated at least one standoff height, and dispensing the determined volume of underfill material on the substrate, such that the space between the substrate and the at least one semiconductor chip is substantially filled by the underfill material.

In some embodiments, the at least one standoff height includes a plurality of standoff heights, and one or more of the standoff heights is unequal to one or more other standoff heights of the plurality of standoff heights. In some embodiments, calculating the at least one standoff height includes calculating the at least one standoff height based on an image of the substrate and the at least one semiconductor chip electrically connected thereto. In some embodiments, the semiconductor chip is electrically connected to the substrate via a plurality of solder balls and a soldering material having a melting temperature less than or equal to 180 degrees Celsius. In some embodiments, calculating the at least one standoff height includes capturing an image of the semiconductor chip, substrate, and the plurality of solder joints and determining a shape of at least one solder joint formed by the solder material and a solder ball of the plurality of solder balls.

In some embodiments, calculating the at least one standoff height includes calculating the at least one standoff height based on a 3-dimensional x-ray of the substrate and the at least one semiconductor chip electrically connected thereto. In some embodiments, calculating the at least one standoff height includes calculating the at least one standoff height based on laser height sensing. In some embodiments, calculating the at least one standoff height includes calculating the at least one standoff height based on a 3-dimensional automated optical inspection of the substrate and the at least one semiconductor chip electrically connected thereto.

In another embodiment there is a method of dispensing an underfill material on a semiconductor device package, the method includes providing a substrate having a first semiconductor chip electrically connected thereto by a first plurality of solder joints, the first semiconductor chip having a first footprint defined by a length and width of the first semiconductor chip, the substrate having a second semiconductor chip electrically connected thereto by a second plurality of solder joints, the second semiconductor chip having a second footprint defined by a length and width of the second semiconductor chip, calculating a first plurality of standoff heights between the substrate and the first semiconductor chip, calculating a second plurality of standoff heights between the substrate and the second semiconductor chip, determining, based on the calculated first plurality of standoff heights, a first volume of underfill material necessary to substantially fill a space between the substrate and the first semiconductor chip defined by the first footprint of the first semiconductor chip and the calculated first plurality of standoff heights, determining, based on the calculated second plurality of standoff heights, a second volume of the underfill material necessary to substantially fill a space between the substrate and the second semiconductor chip defined by the second footprint of the second semiconductor chip and the calculated second plurality of standoff heights, dispensing the determined first volume of the underfill material on the substrate, such that the space between the substrate and the first semiconductor chip is substantially filled by the first volume of the underfill material, and dispensing the determined second volume of underfill material on the substrate, such that the space between the substrate and the second semiconductor chip is substantially filled by the second volume of the underfill material.

In some embodiments, one or more of the standoff heights of the first plurality of standoff heights is unequal to one or more other standoff heights of the first plurality of standoff heights. In some embodiments, one or more of the standoff heights of the second plurality of standoff heights is unequal to one or more other standoff heights of the second plurality of standoff heights. In some embodiments, calculating the first plurality of standoff heights and second plurality of standoff heights includes calculating the first plurality and second plurality of standoff heights based on capturing images of the substrate and the first and second semiconductor devices electrically connected thereto.

In some embodiments, calculating the first plurality of standoff heights and second plurality of standoff heights includes calculating the first plurality and second plurality of standoff heights based on a 3-dimensional x-ray of the substrate and the first and second semiconductor chips electrically connected thereto. In some embodiments, calculating the first plurality of standoff heights and second plurality of standoff heights includes calculating the first plurality and second plurality of standoff heights based on laser height sensing. In some embodiments, calculating the first plurality of standoff heights and second plurality of standoff heights includes calculating the first plurality and second plurality of standoff heights based on a 3-dimensional automated optical inspection of the substrate and the first and second semiconductor chips electrically connected thereto.

In another embodiment there is a system for dispensing an underfill material on a semiconductor device package including a substrate having at least one semiconductor chip electrically connected thereto by a plurality of solder joints, each semiconductor chip of the at least one semiconductor chip having a footprint defined by a length and width of the semiconductor chip, the system includes one or more memory units each operable to store at least one program, at least one processor communicatively coupled to the one or more memory units, in which the at least one program, when executed by the at least one processor, causes the at least one processor to perform the operations of, calculating at least one standoff height between the substrate and the at least one semiconductor chip, determining, based on the calculated at least one standoff height, a volume of underfill material necessary to substantially fill a space between the substrate and the at least one semiconductor chip defined by the footprint of the at least one semiconductor chip and the calculated at least one standoff height, and causing an underfill dispensing device to dispense the determined volume of underfill material on the substrate such that the space between the substrate and the at least one semiconductor chip is substantially filled.

In some embodiments, the system further includes an image capture device communicatively coupled to the at least one processor, the image capture device configured to capture an image of the substrate and semiconductor chip electrically connected thereto and the calculating the at least one standoff height is based on the image captured by the image capture device. In some embodiments, the system further includes a 3-dimensional x-ray device communicatively coupled to the at least one processor, the 3-dimensional x-ray device configured to generate a 3-dimensional x-ray of the substrate and semiconductor chip electrically connected thereto, and the calculating the at least one standoff height is based on the 3-dimensional x-ray generated by the 3-dimensional x-ray device.

In some embodiments, the system further includes a laser height sensing device communicatively coupled to the at least one processor, the laser height sensing device configured to calculate the at least one standoff height in response to a request from the at least one processor to calculate the at least one standoff height. In some embodiments, the system further includes a 3-dimensional automated optical inspection device communicatively coupled to the at least one processor, the 3-dimensional automated optical inspection device configured to perform a 3-dimensional automated optical inspection of the substrate and semiconductor chip electrically connected thereto, and the calculating the at least one standoff height is based on the performed 3-dimensional automated optical inspection.

BRIEF DESCRIPTION OF THE DRAWINGS

The foregoing summary, as well as the following detailed description, will be better understood when read in conjunction with the appended drawings. For the purpose of illustrating the present disclosure, there are shown in the drawings embodiments, which are presently preferred, wherein like reference numerals indicate like elements throughout. It should be noted, however, that aspects of the present disclosure can be embodied in different forms and thus should not be construed as being limited to the illustrated embodiments set forth herein. The elements illustrated in the accompanying drawings are not necessarily drawn to scale, but rather, may have been exaggerated to highlight the important features of the subject matter therein. Furthermore, the drawings may have been simplified by omitting elements that are not necessarily needed for the understanding of the disclosed embodiments.

In the drawings:

FIG. 2 is side cross-sectional view of another semiconductor device package for use in a method of dispensing an underfill material in accordance with another exemplary embodiment of the present disclosure;

DETAILED DESCRIPTION

The present subject matter will now be described more fully hereinafter with reference to the accompanying Figures, in which representative embodiments are shown. The present subject matter can, however, be embodied in different forms and should not be construed as limited to the embodiments set forth herein. Rather, these embodiments are provided to describe and enable one of skill in the art.

Figure 1A:
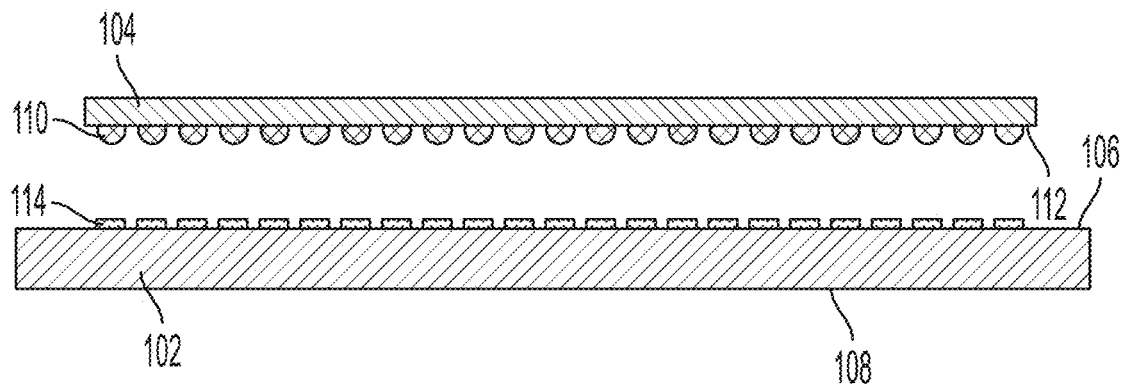
FIG. 1A is a side cross-sectional view of a substrate and semiconductor chip prior to being soldered.
Figure 1B:
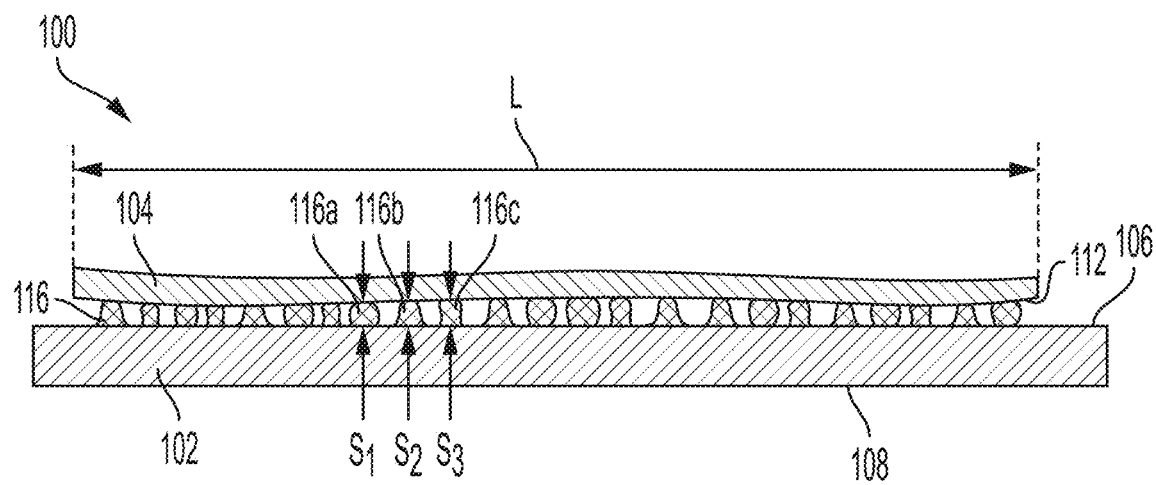
FIG. 1B is a side cross-sectional view of the substrate and semiconductor chip of FIG. 1A following a soldering process forming a semiconductor device package for use in a method of dispensing an underfill material in accordance with an exemplary embodiment of the present disclosure.

Referring to FIG. 1A-1B, there is shown a representative semiconductor device package, generally designated 100, that may be used with exemplary embodiments of the systems and methods for dispensing an underfill material of the present disclosure. The semiconductor device package 100 may include a substrate 102 and at least one semiconductor chip 104 coupled thereto. In some embodiments, the substrate 102 may be a mechanical base support for a semiconductor device package (not shown) and an electrical interface (or electrical circuit) that provides access to the semiconductor chip 104 coupled thereto. For example, the substrate 102 may include an electrical circuit (not shown) including plurality of metal layers and/or traces disposed within the substrate 102, including one or more layers for routing signals such as, but not limited to, input/output signals, power signals, and ground signals using conductive (e.g., copper) traces. In some embodiments, the plurality of layers of the substrate 102 alternate between conductive and non-conductive layers. The conductive layers may include one or more signal traces. The electrical circuit may be positioned between a top planar surface 106 and a bottom planar surface 108 of the substrate 102. The chip 104 comprises a flip chip or BGA device, although chip 104 may comprise other types of devices, such as a land grid array (LGA). Furthermore, although only one chip is shown, it will be understood that the package 100 may include other devices, such as wirebond chips and passive devices.

FIG. 1A illustrates the substrate 102 and semiconductor chip 104 prior to being coupled together to form the semiconductor device package 100 shown in FIG. 1B. In some embodiments, the semiconductor chip 104 includes one or more solder balls 110 positioned on a bottom surface 112 of the semiconductor chip 104 and configured to electrically connect and physically couple the semiconductor chip 104 to the substrate 102. Each of the solder balls 110 may be generally the same shape (e.g., spherical) and/or be comprised of generally the same volume of solder material.

There may be portions of solder material 114 applied to the top planar surface 106 of the substrate 102 (e.g., PCB pads). The solder material 114 may be a solder paste including a combination of a powder made up of metal solder particles and a flux material. The flux material may be a sticky flux that has adhesive characteristics. The solder material 114, while a paste, may flow like a fluid when a sufficiently large load or stress is applied to it. In some embodiments, the solder material 114 may be a low-temperature solder (LTS) material. For example, the solder material 114 may be a solder material having a reflow temperature that is less than or equal to 180 degrees Celsius, whereas conventional solder materials have a reflow temperature of between about 240 degrees Celsius to about 250 degrees Celsius. In some embodiments, the solder material 114 includes bismuth. In other embodiments, the solder material 114 may be any conventional solder material known to those skilled in the art. In some embodiments, the solder material 114 is in direct contact with at least a portion of the electrical circuit of the substrate 102. For example, the solder material 114 may be in direct contact with the portions of the electrical circuit exposed at the top planar surface 106 of the substrate 102. In some embodiments, the solder material 114 is in direct contact with electrical contact pads (not shown) that are electrically connected to the electrical circuit of the substrate 102.

In some embodiments, the solder balls 110 are mounted directly onto the solder material 114 thereby coupling the semiconductor chip 104 to the substrate 102 for soldering. For example, the semiconductor chip 104 mounted to the substrate 102, via the solder balls 110 and solder material 114, may be placed inside a reflow oven to cause the solder material 114 and/or solder balls 110 to melt to form a permanent solder joint between each of the solder balls 110 and corresponding portions of solder material 114. FIG. 1B illustrates the substrate 102 and semiconductor chip 104 where permanent solder joints 116 have been formed following reflow soldering of the solder balls 110 and solder material 114. Solder joints 116, in some embodiments, physically attach bottom surface 112 of semiconductor chip 104 to top planar surface 106 of substrate 102.

As illustrated in FIG. 1B, the solder joints 116 formed by soldering the solder material 114 and solder balls 110 may be non-uniform in shape and/or height. For example, each of the solder joints 116a-116c have a shape and height that is different from one another. As such, the non-uniform solder joints 116 may result in there being variations in the standoff height between the semiconductor chip 104 and substrate 102 along the length L of the semiconductor chip 104. Standoff height, as used herein, refers to the distance between the top planar surface 106 of the substrate 102 and the bottom surface 112 of the semiconductor chip 104 as measured in a direction perpendicular to the top planar surface 106 of the substrate 102. In some situations, the variations in the solder joints may result in warping of the semiconductor chip 104 such that bottom surface 112 is not necessarily planar. The warpage shown in the drawing is exaggerated, and as understood by those of skill in the art, may comprise a smile, a frown, or combinations thereof. Such warpage may lead to unevenness in the standoff height. The methods and systems of the present disclosure that are described herein allow for more accurate dispensing of underfill material when variations in standoff height and/or variations in solder joint geometry are present in a semiconductor package (e.g., package 100). As such, it should be understood that FIG. 1B illustrates an example semiconductor device package 100 having variations in both standoff height and solder joint geometry provided to better explain the systems and methods of the present disclosure discussed herein.

In some embodiments, there may be at least one standoff height along the length L of the semiconductor chip 104 that is different from at least one other standoff height measured at a different location along length L. For example, there may be a first standoff height $S_1$ between the semiconductor chip 104 and the substrate 102 where the solder joint 116a is located. Similarly, there may be a second standoff height $S_2$ where the solder joint 116b is located and a third standoff height $S_3$ where the solder joint 116c is located. In the example illustrated in FIG. 1B, each of the standoff heights $S_1$, $S_2$ and $S_3$ are different from one another. For example, the first standoff height $S_1$ is less than the second standoff height $S_2$ and the second standoff height $S_2$ is less than the third standoff height $S_3$. It will be understood that there may be variations in the standoff heights along the length L of the semiconductor chip 104 and that only three standoff heights $S_1$-$S_3$ are discussed herein for sake of brevity and so as not to obscure pertinent aspects of the present disclosure. In some embodiments, one or more of the standoff heights along the length L of the semiconductor chip 104 may be generally equal to one or more other standoff heights.

In some embodiments, one or more of the solder joints 116 has a geometry that is different from one or more other solder joints 116 caused by variations in diffusion rate at the solder joint 116, uneven wetting during solder joint 116 formation, and/or variations in the amount of solder material 114 dispensed on the substrate 102. For example, the first solder joint 116a may have generally convex shaped outer edges when viewed from the side (as illustrated in FIG. 1B) and the third solder joint 116c may have generally concave shaped outer edges. The second solder joint 116b may have outer edges that are generally convex in shape and transition to a generally concave shape as the solder joint 116b extends upwardly from the substrate 102 towards the semiconductor chip 104. It will be understood that the specific geometries of the solder joints 116a-116c are for illustrative purposes only and that there may be one or more other solder joints 116 having different geometries than those illustrated in FIG. 1B.

Figure 1C:
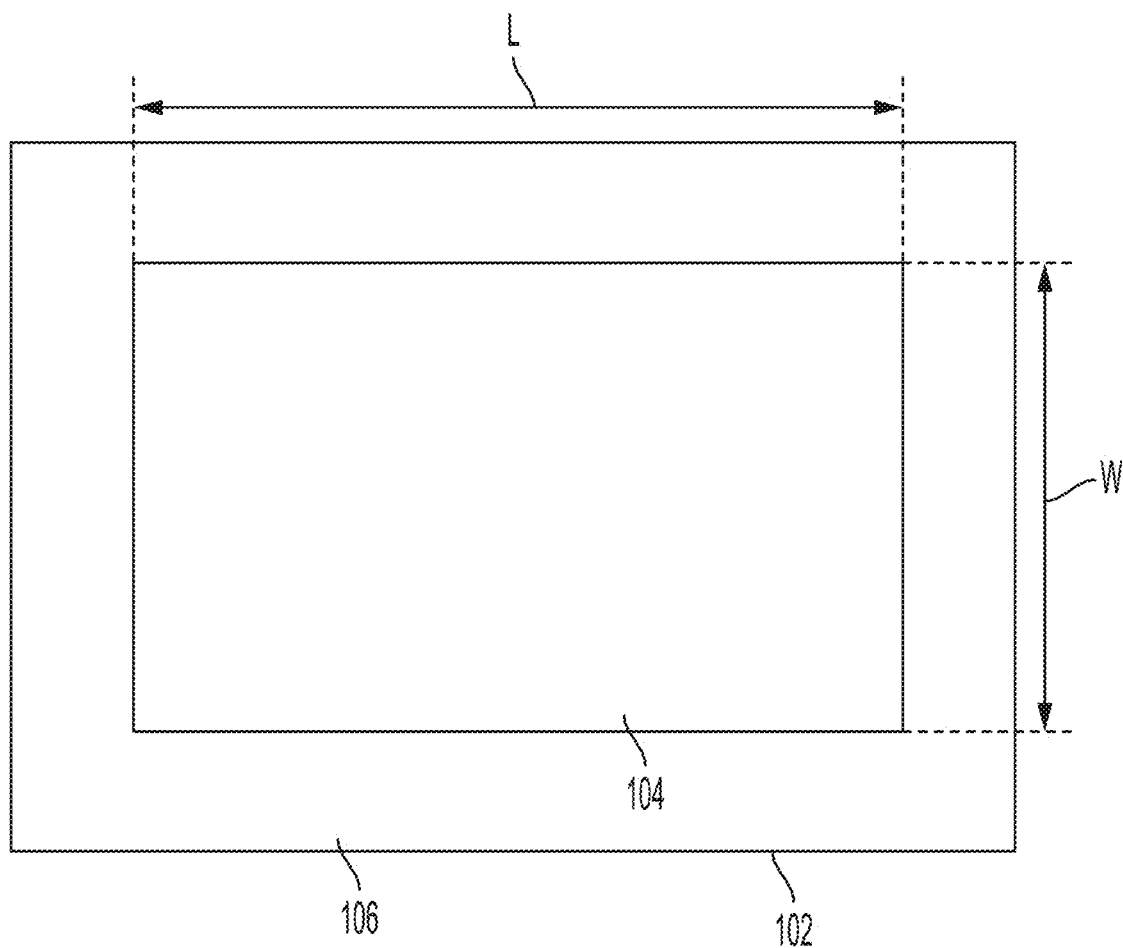
FIG. 1C is a top elevational view of the semiconductor device package of FIG. 1B.

Referring to FIG. 1C, the semiconductor chip 104 may have a footprint defined by the length L and width W of the semiconductor chip 104. The footprint of the semiconductor chip 104 may refer to the area on the top planar surface 106 of the substrate 102 that the semiconductor chip 104 covers. In some embodiments, the length L and width W of the semiconductor chip 104 are based on known dimensions of the semiconductor chip 104 prior to the semiconductor chip 104 being soldered to the substrate 102. In some embodiments, the length L and/or width W of the semiconductor chip 104 may correspond to an existing industry standard form factors. In other embodiments, at least one of the length L and/or width W may be determined after the semiconductor chip 104 has been soldered to the substrate 102 via the solder balls 110 and solder material 114.

Referring to FIGS. 1B-1C, the semiconductor chip 104 may be offset from the substrate by the solder joints 116. For example, the solder joints 116 may space the bottom surface 112 of the semiconductor chip 104 from the top planar surface 106 of the substrate 102. As such, there may be a space between the semiconductor chip 104 and substrate 102 where an underfill material may be deposited. The space between the semiconductor chip 104 and substrate 102 may be defined by the footprint of the semiconductor chip 104 (e.g., the length L and width W) and the standoff heights which are defined by one or more of the corresponding solder joints 116. For example, the space between the semiconductor chip 104 and substrate 102 may be calculated, or estimated, based on the length L and width W of the semiconductor chip 104 and at least one of the standoff heights (e.g., standoff heights $S_1$, $S_2$, and/or $S_3$).

In some embodiments, the amount of underfill material deposited within the space between the semiconductor chip 104 and substrate 102 may be dependent upon the shape and/or geometry of the solder joints 116. Put another way, the solder joints 116 are positioned within the space between the semiconductor chip 104 and substrate 102 and as such the amount of underfill material required to fill the space may be dependent upon the shape and/or geometry of the solder joints 116. For example, each solder joint 116 has a solder joint volume that is dependent on the shape and/or geometry of the solder joint 116 and that fills a portion of the space between the semiconductor chip 104 and substrate 102. Put another way, each solder joint 116 has an associated solder joint volume that fills a portion of the space between the semiconductor chip 104 and substrate 102. In some embodiments, the solder joint volume of one or more of the solder joints 116 may be different from the solder joint volume of one or more other solder joints 116.

Referring to FIG. 2, there is shown a semiconductor device package, generally designated 200, that may be included with another exemplary embodiment of the present disclosure. The semiconductor device package 200 may be generally similar to the semiconductor device package 100, described above with reference to FIGS. 1A-1C, except that there is another semiconductor device included in the semiconductor device package 200. The semiconductor device package 200 may include a substrate 202, and a first semiconductor chip 204a and a second semiconductor chip 204b each electrically and physically connected to the substrate 202. The first semiconductor chip 204a may be electrically connected to the substrate 202 by a first plurality of solder joints 216a. Similarly, the second semiconductor chip 204b may be electrically connected to the substrate 202 by a second plurality of solder joints 216b. The solder joints 216a and 216b may be generally the same as the solder joints 116. For example, each of the solder joints 216a and 216b may formed in generally the same manner as the solder joints 116 as described above with reference to FIGS. 1A-1B.

In some embodiments, there are one or more first standoff heights $S_a$ between the substrate 202 and the first semiconductor chip 204a defined by one or more corresponding first solder joints 216a. In some embodiments, there may be a plurality of first standoff heights $S_a$ each being defined by a corresponding one of the first plurality of solder joints 216a. For example, each of the first solder joints 216a electrically connecting the first semiconductor chip 204a to the substrate 202 may define a corresponding first standoff height $S_a$. Similarly, there may be one or more second standoff heights $S_b$ between the substrate 202 and the second semiconductor chip 204b that are defined by one or more corresponding second solder joints 216b. In some embodiments, there is a plurality of second standoff heights $S_b$ each of which being defined by a corresponding one of the second plurality of solder joints 216b. A single first and second standoff height $S_a$ and $S_b$ are referenced in FIG. 2, however it will be understood that each of the solder joints 216a and 216b may define a first and second standoff height $S_a$ and $S_b$ respectively.

In some embodiments, one or more first standoff heights $S_a$ may be different from one or more of the second standoff heights $S_b$. Put another way, the first semiconductor chip 204a may be offset from the substrate 202 by a distance that is not equal to the offset distance of the second semiconductor chip 204b from the substrate 202. In some embodiments, the one or more first standoff heights $S_a$ may be averaged to determine an average first standoff height and similarly, the one or more second standoff heights $S_b$ may be averaged to determine an average second standoff height. In some embodiments, each of the first standoff heights $S_a$ may be greater than any of the second standoff heights $S_b$, or vice versa. For example, the standoff height $S_a$ having the lowest value of the first plurality of standoff heights $S_a$ may be greater than the standoff height $S_b$ having the greatest value of the second plurality of standoff heights $S_b$, or vice versa. In other embodiments, the standoff heights $S_a$ and $S_b$ may be about the same as one another. Put another way, the offset of the first and second semiconductor devices 204a, 204b from the substrate 202 may be about the same or generally equal.

In some embodiments, each of the first and second semiconductor chips 204a, 204b may have a footprint defined in generally the same manner as the footprint of the semiconductor chip 104 shown and described above with reference to FIG. 1C. For example, the first semiconductor chip 204a may have a first footprint and the second semiconductor chip 204b may have a second footprint. The first footprint may be defined by the length $L_a$ and width (not shown) of the first semiconductor chip 204a and the second footprint may be defined by the length $L_b$ and width (not shown) of the second semiconductor chip 204b. The widths of each of the first and second semiconductor chips 204a, 204b, although not shown, may be defined in generally the same manner as the width W shown and described above with reference to FIG. 1C.

In some embodiments, each of the semiconductor chips 204a, 204b defines a corresponding space between the substrate 202 and the respective first and second semiconductor chips 204a, 204b in generally the same manner as described above with reference to FIGS. 1B-1C. For example, there may be a first space between the first semiconductor chip 204a and the substrate 202 that is defined by one or more of the first standoff heights $S_a$ and the footprint of the first semiconductor chip 204a. Similarly, there may be a second space between the second semiconductor chip 204b and the substrate 202 that is defined by one or more of the second standoff heights $S_b$ and the footprint of the second semiconductor chip 204b. As such, the space between the first semiconductor chip 204a and substrate 202 may be partially filled by the first plurality of solder joints 216a and the space between the second semiconductor chip 204b and substrate 202 may be partially filled by the second plurality of solder joints 216b.

It will be understood that although two semiconductor chips 204a, 204b are illustrated in FIG. 2 and a single semiconductor chip 104 is illustrated in FIGS. 1A-1C, the embodiments of the present disclosure are not limited to semiconductor device packages including one or two semiconductor chips. For example, the methods of the present disclosure, discussed in more detail below, may be performed on semiconductor device packages having one, two, three, four or more than four semiconductor chips included therewith.

Figure 3:
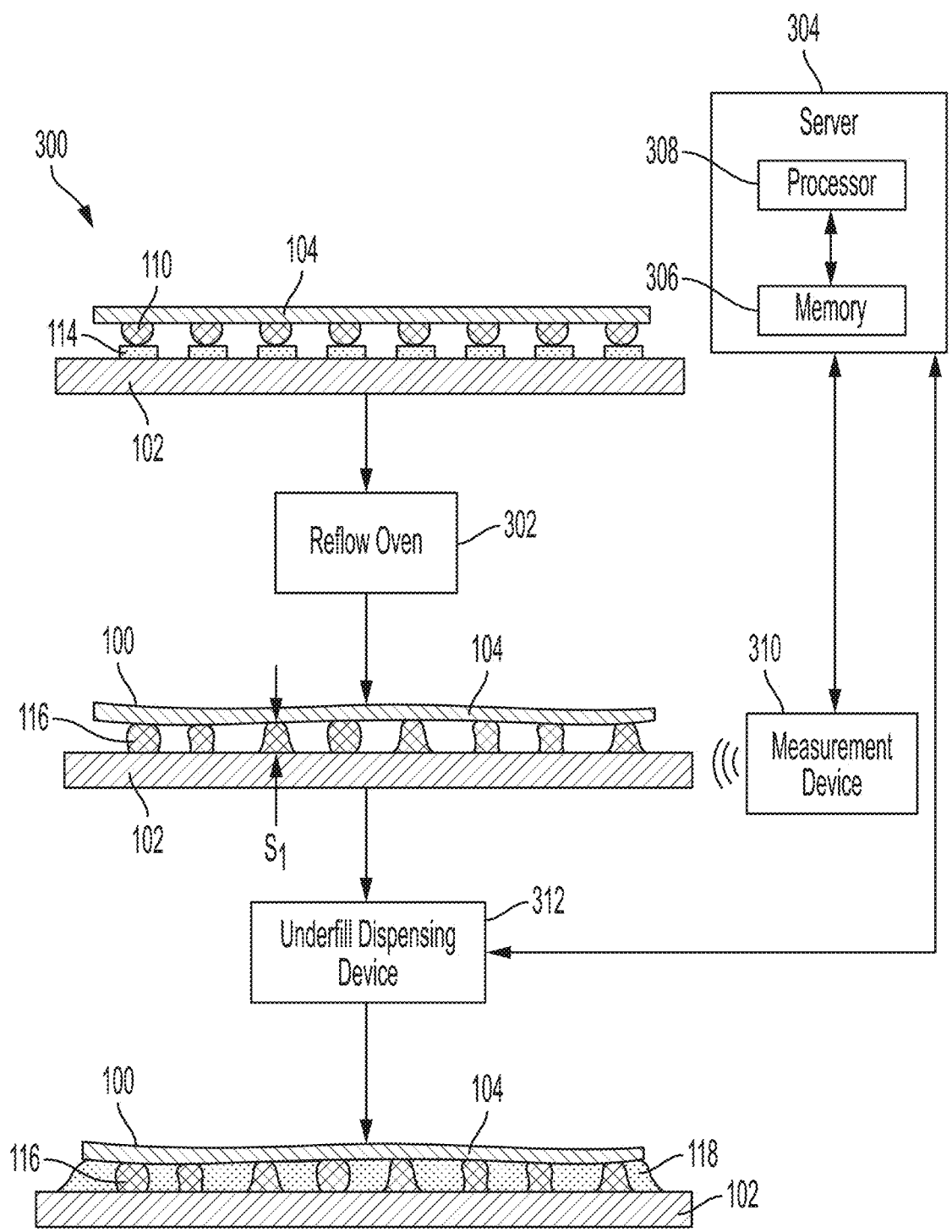
FIG. 3 is a schematic view of a system for dispensing an underfill material on a semiconductor device package in accordance with an exemplary embodiment of the present disclosure.

Referring to FIG. 3, there is shown a schematic of a system, generally designated 300, for dispensing an underfill material on a semiconductor device package, in accordance with an exemplary embodiment of the present disclosure. The system 300 illustrated in FIG. 3 may be used with the semiconductor device package 100, however it will be understood that the system 300 may include the semiconductor device package 200 shown and described in FIG. 2. In some embodiments, the system 300 includes a reflow oven 302 for soldering the semiconductor chip 104 to the substrate 102. For example, the semiconductor chip 104 coupled to the substrate 102 via the solder material 114 and solder balls 110 may be placed within the reflow oven 302 and undergo a reflow soldering process, as described above, to form the solder joints 116 of the semiconductor device package 100. In other embodiments, the reflow oven 302 may be separate from the system 300 of the present disclosure.

The system 300 may include a server 304 having one or more memory units 306 communicatively coupled to at least one processor 308. The server 304 may include one or more computing servers that are configured to execute one or more programs. A program for execution on the server 304 refers to a collection of computer readable and executable code configured to perform one or more operations. In some embodiments, the one or more memory units 306 may be operable to store at least one program and the processor 308 may be configured to execute the at least one program to perform various operations included in the at least one program. In some embodiments, the server 304 may include one or more electronic storage means (e.g., a database or any other electronic storage device) for storing one or more calculated values.

In some embodiments, the at least one program, when executed by the processor 308, may cause the processor 308 to calculate at least one standoff height (e.g., standoff height $S_1$) between the substrate 102 and the semiconductor chip 104. For example, the system 300 may include a measurement device 310 that is communicatively coupled to the server 304 and configured to calculate the at least one standoff height $S_1$. Calculating the standoff height $S_1$ may include measuring, via the measurement device 310, the standoff height $S_1$. In some embodiments, a plurality of standoff heights $S_1$ may be calculated. In other embodiments, each standoff height $S_1$ corresponding to each solder joint 116 may be calculated. In some embodiments, the calculated standoff height $S_1$ may be transmitted from the measurement device to the server 304.

In some embodiments, the measurement device 310 is an image capture device that is configured to capture an image of the substrate 102 and semiconductor chip 104. The image captured by the image capture device may be used to calculate the at least one standoff height $S_1$. For example, the image capture device may transmit the image to the server 304 and the server 304, via the processor 308 and memory units 306, may be configured to calculate the standoff height $S_1$ based on the received image. In some embodiments, the processor 308 may be configured to determine the shape, geometry and/or orientation of the solder joints 116 based on the image captured by the image capture device.

In some embodiments the measurement device 310 is a 3-dimensional (3D) x-ray device that is configured to generate a 3D x-ray of the substrate 102 and semiconductor chip 104. The 3D x-ray device may be communicatively coupled to the at least one processor 308, via the server 304. In some embodiments, the 3D x-ray device may generate the 3D x-ray and transmit it to the server 304. The server 304, via the processor 308, may be configured to calculate the at least one standoff height $S_1$ based on the 3D x-ray generated by the 3D x-ray device. For example, the processor 308 may be configured to perform one or more analyses on the 3D x-ray in order to calculate the at least one standoff height $S_1$. In some embodiments, the processor 308 may be configured to determine the shape, geometry and/or orientation of the solder joints 116 based on the 3D x-ray generated by the 3D x-ray device.

In some embodiments, the measurement device 310 is a laser height sensing device configured to calculate the at least one standoff height $S_1$. In some embodiments, the laser height sensing device may be communicatively coupled to the processor 308 and configured to, in response to a request from the at least one processor 308, calculate the at least one standoff height $S_1$. In some embodiments, the laser height sensing device may transmit the calculated at least one standoff height $S_1$ to the server 304.

In some embodiments, the measurement device 310 is a 3D automated optical inspection device configured to perform a 3D automated optical inspection of the substrate 102 and semiconductor chip 104. The 3D automated optical inspection device may be communicatively coupled to the at least one processor 308, via the server 304, such that data generated by the 3D automated optical inspection may be transmitted to the server 304. In some embodiments, the calculated at least one standoff height $S_1$ may be based on the data generated by the performed 3D automated optical inspection. For example, the processor 308 may be configured to calculate the at least one standoff height $S_1$ based on the received data generated by the performed 3D automated optical inspection. In other embodiments, the 3D automated optical inspection device may be configured to perform the 3D automated optical inspection and calculate the at least one standoff height $S_1$ and transmit the calculated standoff height $S_1$ to the processor 308. In some embodiments, the processor 308 may be configured to determine the shape, geometry and/or orientation of the solder joints 116 based on the 3D automated optical inspection performed by the 3D automated optical inspection device.

In some embodiments, the system 300 may include more than one measurement device 310 communicatively coupled to the server 304. In some embodiments, the system 300 may include any combination of the above-mentioned embodiments of the measurement device 310. For example, the system 300 may include any combination of image capture devices, 3D x-ray devices, laser height sensing devices, and 3D automated optical inspection devices. In some embodiments, the system 300 may include two or more of a single type of measurement device 310. For example, the system 300 may include two or more image capture devices each communicatively coupled to the processor 308.

In some embodiments, the at least one program, when executed by the processor 308, causes the processor 308 to determine, based on the calculated at least one standoff height $S_1$, a volume of underfill material 118 to fill the space between the substrate 102 and the semiconductor chip 104. For example, the processor 308 may determine the volume of underfill material 118 based on the footprint of the semiconductor chip 104 and the calculated at least one standoff height $S_1$. In some embodiments, the footprint of the semiconductor chip 104 may be a predetermined value based on the selected semiconductor device and/or industry standard form factors. The predetermined footprint value may be inputted by a user to system 300, and/or stored within one or more memory units 306. In other embodiments, system 300 may be configured to measure or calculate the footprint of semiconductor chip 104 (e.g., using data obtained from measurement device 310 or a separate measurement device). The determined volume of underfill material 118 may be a volume of underfill material 118 configured to substantially fill the space between the substrate 102 and the semiconductor chip 104.

In some embodiments, the determined volume of underfill material 118 may be based on, at least partially, the shape and/or geometry of the solder joints 116. For example, the data transferred to the server 304 by the measurement device 310 may include information relating to the shape, geometry, and/or orientation of the solder joints 116. As such, the volume of the space that is filled by one or more of the solder joints 116 may be calculated, via the processor 308, and used to determine the volume of underfill material 118. For example, the volume of the space between the substrate 102 and semiconductor chip 104 may be determined based on the calculated standoff height $S_1$ and a known footprint (e.g., the length and width) of the semiconductor chip 104. The determined volume of the solder joints 116 may be subtracted from the determined volume of the space in order to determine a remaining volume for which the underfill material 118 may fill.

In some embodiments, determining the volume of the underfill material 118 may include the following steps: 1) multiplying the at least one standoff height $S_1$ with the known footprint of the semiconductor chip 104, and 2) subtracting the volume of the solder joints 116 from the product calculated in step 1). In some embodiments, determining the volume of underfill material 118 may include the step 3) of adding an underfill material constant (e.g., a volume of underfill material required to substantially cover the side surfaces of the solder joints 116) to the calculation from step 2). In some embodiments, step 1) may include calculating an average of a plurality of standoff heights and multiplying the average by the known footprint of the semiconductor chip 104. The weight of the determined volume of the underfill material 118 may be determined by multiplying the determined volume of underfill material 118 by a known density of the underfill material 118. As such, the processor 308 may determine the volume of underfill material 118 and, in some embodiments, the weight of the underfill material 118 that is needed or necessary to be deposited on the substrate 102 in order to substantially fill the space between the substrate 102 and semiconductor chip 104.

In this manner, the remaining volume of the space to be filled by the underfill material may be accurately determined for a given semiconductor device package 100. By determining, the remaining volume to be filled for a given semiconductor device package, the volume of underfill material may be more accurately determined to achieve the desired coverage when compared to conventional methods which rely on estimations and/or that do not include any measurement of standoff height(s). In embodiments where the solder material 114 is an LTS paste, the risk of standoff height variations occurring increases and therefore the system 300 and methods discussed below of the present disclosure may reduce the risk of improper coverage of underfill material caused by variations in standoff height. In some embodiments, the system 300 may be used to calculate at least one standoff height and determine a volume of underfill material to achieve a desired coverage for a plurality of semiconductor device packages. For example, the system may calculate standoff heights for a plurality semiconductor device packages in batches, and determine, based on said calculations, a volume of underfill material for each package.

In some embodiments, the at least one program, when executed by the processor 308, may cause the processor 308 to cause an underfill dispensing device 312 to dispense the determined volume of underfill material 118. For example, the system 300 may include an underfill dispensing device 312 that is communicatively coupled to the processor 308 via the server 304. The processor 308 may transmit data to the underfill dispensing device 312, via server 304, that includes an indication of the determined volume of underfill material 118. The underfill dispensing device 312, in response to receiving the data transmitted from the processor 308, may dispense the determined volume of underfill material 118 on the substrate 102 such that the space between the substrate 102 and the semiconductor chip 104 is substantially filled. In some embodiments, the underfill material 118 may be a composite material including an epoxy polymer and an amount of a filler material. The underfill dispensing device 312 may be any type of epoxy dispensing device, such as, but not limited to a needle or syringe epoxy dispensing device, and a jet spray epoxy dispensing device. The underfill material 118 may be any conventional underfill material 118 known to those skilled in the art. In some embodiments, at a time following the dispensing of the underfill material 118, the semiconductor device package 100 may undergo a curing step to allow the underfill material 118 to cure or harden.

Figure 4:
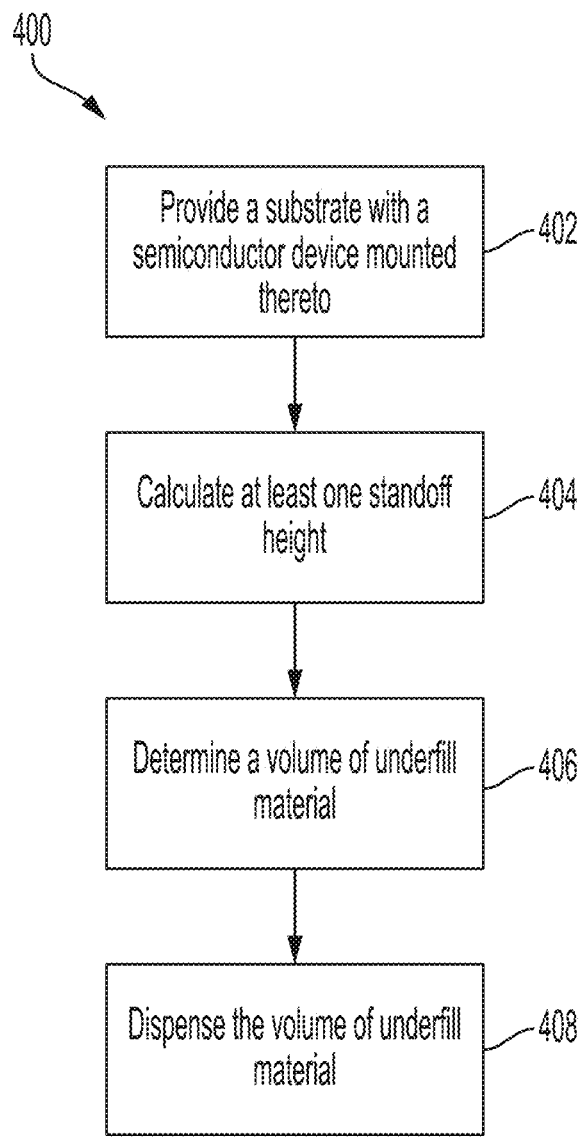
FIG. 4 is a flowchart illustrating a method of dispensing an underfill material on a semiconductor device package in accordance with an exemplary embodiment of the present disclosure.

Referring to FIG. 4, there is shown a flowchart illustrating a method, generally designated 400, of dispensing an underfill material on a semiconductor device package in accordance with an exemplary embodiment of the present disclosure. The method 400 may include the step 402 of providing a substrate with a semiconductor device mounted thereto. For example, the substrate 102 may be provided having at least one semiconductor chip 104 electrically connected thereto. The at least one semiconductor chip 104 may be offset from the substrate 102 by a plurality of solder joints 116. Each semiconductor device 102 of the at least one semiconductor device may have a footprint (as discussed above with reference to FIG. 1C) that is defined by a length L and width W of the semiconductor chip 104.

In some embodiments, the step 402 may include providing a substrate having at least two semiconductor devices mounted thereto. For example, the substrate 202 having a first semiconductor chip 204a and second semiconductor chip 204b may be provided. The first semiconductor chip 204a may be electrically connected to the substrate 202 via a first plurality of solder joints 216a. the second semiconductor chip 204b may be electrically connected to the substrate via a second plurality of solder joints 216b. The first semiconductor chip 204a may have a first footprint defined by the length $L_a$ and width of the first semiconductor chip 204a and the second semiconductor device may have a second footprint defined by the length $L_b$ and width of the second semiconductor device.

In some embodiments, the method 400 may include the step 404 of calculating at least one standoff height. For example, the system 300 may be used to calculate at least one standoff height $S_1$ between the substrate 102 and the at least one semiconductor chip 104. In some embodiments, a plurality of standoff heights (e.g., heights $S_1$-$S_3$) may be calculated by the system 300. In other embodiments, the step 404 may include calculating at least one first standoff height associated with a first semiconductor device and at least one second standoff height associated with a second semiconductor device. For example, the first standoff height $S_a$ between the substrate 202 and the first semiconductor chip 204a and the second standoff height $S_b$ between the substrate 202 and second semiconductor chip 204b may each be calculated. In some embodiments, a plurality of first standoff heights $S_a$ and second standoff heights $S_b$ may be calculated by the system 300.

In some embodiments, calculating the at least one standoff heights described above may include calculating, based on capturing an image of the substrate and semiconductor device electrically connected thereto, the at least one standoff height. For example, the measurement device 310 of the system 300 may be an image capturing device configured to capture an image of the substrate 102 and the semiconductor chip 104, as discussed above with reference to FIG. 3. In some embodiments, the image captured may be used to determine a shape of at least one solder joint formed by the solder material and corresponding solder ball. For example, the image captured of solder joints 116 may be used to determine the shape, orientation and/or geometry of said joints 116.

In some embodiments, calculating the first plurality of standoff heights and second plurality of standoff heights includes calculating, based on capturing an image of the substrate and the first and second semiconductor devices electrically connected thereto, the first plurality and second plurality of standoff heights. For example, the measurement device 310 of the system 300 may be an image capture device that is configured to capture an image of the substrate 202 and the first and second semiconductor devices 204a, 204b such that the system 300 may be used to calculate the first and second pluralities of standoff heights $S_a$ and $S_b$.

In some embodiments, calculating the at least one standoff height described above may include calculating, based on a 3D x-ray of the substrate and at least one semiconductor device electrically connected thereto, the at least one standoff height. For example, the measurement device 310 of the system 300 may be a 3D x-ray device configured to generate a 3D x-ray of the substrate 102 and the at least one semiconductor chip 104 such that the system 300 may calculate the at least one standoff height, such as one or more of standoff heights $S_1$-$S_3$ (or any other standoff height(s) in package 100). In some embodiments, calculating the first plurality of standoff heights and second plurality of standoff heights includes calculating, based on a 3D x-ray of the substrate and the first and second semiconductor devices electrically connected thereto, the at least one standoff height. For example, the measurement device 310 of the system 300 may be a 3D x-ray device configured to generate a 3D x-ray of the substrate 202, the first semiconductor chip 204a and the second semiconductor chip 204b such that the system 300 may calculate the first and second pluralities of standoff heights $S_a$ and $S_b$.

In some embodiments, calculating the at least one standoff height includes calculating, based on laser height sensing, the at least one standoff height. For example, the measurement device 310 of the system 300 may be a laser height sensing device configured to perform laser height sensing on the substrate 102 and semiconductor chip 104 such that the system 300 may calculate the at least one standoff height. In some embodiments, calculating the first plurality of standoff heights and second plurality of standoff heights includes calculating, based on laser height sensing, the first and second pluralities of standoff heights. For example, the laser height sensing device of the system 300 may perform laser height sensing on substrate 202, first semiconductor chip 204a and second semiconductor chip 204b such that the system 300 may calculate the first and second pluralities of standoff heights $S_a$ and $S_b$.

In some embodiments, calculating the at least one standoff height includes calculating, based on a 3D automated optical inspection of the substrate and at least one semiconductor device electrically connected thereto, the at least one standoff height. For example, the measurement device 310 of the system 300 may be a 3D automated optical inspection device configured to perform a 3D automated optical inspection of the substrate 102 and semiconductor chip 104 such that the system 300 may calculate the at least one standoff height (e.g., one or more of standoff heights $S_1$-$S_3$) based on the performed 3D automated optical inspection. In some embodiments, calculating the first plurality of standoff heights and the second plurality of standoff heights includes calculating, based on a 3D automated optical inspection of the substrate and the first and second semiconductor devices electrically connected thereto, the at least one standoff height. For example, the 3D automated optical inspection device of the system 300 may perform the 3D automated optical inspection of the substrate 202 and first and second semiconductor devices 204a, 204b such that the system 300 may calculate the first and second pluralities of standoff heights $S_a$ and $S_b$.

In some embodiments, the method 400 may include the step 406 of determining a volume of underfill material. For example, the step 406 may include determining, based on the calculated at least one standoff height from step 404 (e.g., one or more of standoff heights $S_1$-$S_3$), a volume of underfill material 118 configured to substantially fill the space between the substrate 102 and the at least one semiconductor chip 104 defined by the footprint (e.g., the length L and width W) of the at least one semiconductor chip 104 and the calculated at least one standoff height. In some embodiments, the system 300 may be configured to determine the volume of underfill material 118 as described above with reference to FIG. 3.

In other embodiments, the step 404 includes determining, based on the calculated first plurality of standoff heights $S_a$, a first volume of underfill material configured to substantially fill a space between the substrate 202 and the first semiconductor chip 204a defined by the first footprint of the first semiconductor chip 204a and the calculated first plurality of standoff heights $S_a$. The step 404 may further include determining, based on the calculated second plurality of standoff heights $S_b$, a second volume of the underfill material configured to substantially fill a space between the substrate 202 and the second semiconductor chip 204b defined by the second footprint of the second semiconductor chip 204b and the calculated second plurality of standoff heights $S_b$. In some embodiments, the system 300 is configured to determine the first and second volumes of underfill material in generally the same manner as described above with reference to FIG. 3.

The method 400 may include the step 408 of dispensing the volume of underfill material determined in step 406. For example, the determined volume of underfill material 118 may be dispensed on the substrate 102, such that the space between the substrate 102 and the at least one semiconductor chip 104 is substantially filled. In some embodiments, the underfill dispensing device 312 of the system 300 is configured to dispense the determined volume of underfill material 118 on the substrate 102. In other embodiments, the step 408 includes dispensing the determined first volume of the underfill material on the substrate 202, such that the space between the substrate 202 and the first semiconductor chip 204a is substantially filled and dispensing the determined second volume of underfill material on the substrate 202, such that the space between the substrate 202 and the second semiconductor chip 204b is substantially filled.

While the description above has emphasized reducing voids, especially when the chip may have some warpage, it will be understood by those skilled in the art that calculating and applying just the volume of underfill needed may result in significant cost savings.

It will be appreciated by those skilled in the art that changes could be made to the exemplary embodiments shown and described above without departing from the broad inventive concepts thereof. It is understood, therefore, that this invention is not limited to the exemplary embodiments shown and described, but it is intended to cover modifications within the spirit and scope of the present invention as defined by the claims. For example, specific features of the exemplary embodiments may or may not be part of the claimed invention and various features of the disclosed embodiments may be combined. The words "right", "left", "lower" and "upper" designate directions in the drawings to which reference is made. Unless specifically set forth herein, the terms "a", "an" and "the" are not limited to one element but instead should be read as meaning "at least one". As used herein, the term "about" may refer to +/−10% of the value referenced. For example, "about 9" is understood to encompass 8.1 and 9.9.

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

Further, to the extent that the methods of the present invention do not rely on the particular order of steps set forth herein, the particular order of the steps should not be construed as limitation on the claims. Any claims directed to the methods of the present invention should not be limited to the performance of their steps in the order written, and one skilled in the art can readily appreciate that the steps may be varied and still remain within the spirit and scope of the present invention.

What is claimed is:

1. A method of dispensing an underfill material on a semiconductor device package, the method comprising:
   providing a substrate having a semiconductor chip electrically connected thereto and offset from the substrate by a plurality of solder joints, the semiconductor chip having a footprint defined by a length and width of the semiconductor chip;
   calculating a plurality of standoff heights between the substrate and the semiconductor chip while the semiconductor chip is electrically connected to the substrate by the plurality of solder joints, wherein one or more standoff heights of the calculated plurality of standoff heights is unequal to one or more other standoff heights of the plurality of calculated standoff heights;
   determining, based on the calculated plurality of standoff heights, a volume of underfill material needed to substantially fill a space between the substrate and the semiconductor chip defined by the footprint of the semiconductor chip and the calculated plurality of standoff heights; and
   dispensing the determined volume of underfill material on the substrate, such that the space between the substrate and the semiconductor chip is substantially filled by the underfill material.

2. The method of claim 1, wherein calculating the plurality of standoff heights includes calculating the plurality of standoff heights based on an image of the substrate and the semiconductor chip electrically connected thereto.

3. The method of claim 1, wherein the semiconductor chip is electrically connected to the substrate via a plurality of solder balls and a soldering material having a melting temperature less than or equal to 180 degrees Celsius.

4. The method of claim 3, wherein calculating the plurality of standoff heights includes capturing an image of the semiconductor chip, substrate, and the plurality of solder joints and determining a shape of at least one solder joint formed by the solder material and a solder ball of the plurality of solder balls.

5. The method of claim 1, wherein calculating the plurality of standoff heights includes calculating the plurality of standoff heights based on a 3-dimensional x-ray of the substrate and the semiconductor chip electrically connected thereto.

6. The method of claim 1, wherein calculating the plurality of standoff heights includes calculating the plurality of standoff heights based on laser height sensing.

7. The method of claim 1, wherein calculating the plurality of standoff heights includes calculating the plurality of standoff heights based on a 3-dimensional automated optical inspection of the substrate and the semiconductor chip electrically connected thereto.

8. A method of dispensing an underfill material on a semiconductor device package, the method comprising:
   providing a substrate having a first semiconductor chip electrically connected thereto by a first plurality of solder joints, the first semiconductor chip having a first footprint defined by a length and width of the first semiconductor chip, the substrate having a second semiconductor chip electrically connected thereto by a second plurality of solder joints, the second semiconductor chip having a second footprint defined by a length and width of the second semiconductor chip;
   calculating a first plurality of standoff heights between the substrate and the first semiconductor chip while the first semiconductor chip is electrically connected to the substrate by the first plurality of solder joints, one or more standoff heights of the calculated first plurality of standoff heights being unequal to one or more other standoff heights of the calculated first plurality of standoff heights;

calculating a second plurality of standoff heights between the substrate and the second semiconductor chip while the second semiconductor chip is electrically connected to the substrate by the second plurality of solder joints, one or more standoff heights of the calculated second plurality of standoff heights being unequal to one or more other standoff heights of the calculated second plurality of standoff heights;

determining, based on the calculated first plurality of standoff heights, a first volume of underfill material necessary to substantially fill a space between the substrate and the first semiconductor chip defined by the first footprint of the first semiconductor chip and the calculated first plurality of standoff heights;

determining, based on the calculated second plurality of standoff heights, a second volume of the underfill material necessary to substantially fill a space between the substrate and the second semiconductor chip defined by the second footprint of the second semiconductor chip and the calculated second plurality of standoff heights;

dispensing the determined first volume of the underfill material on the substrate, such that the space between the substrate and the first semiconductor chip is substantially filled by the first volume of the underfill material; and dispensing the determined second volume of underfill material on the substrate, such that the space between the substrate and the second semiconductor chip is substantially filled by the second volume of the underfill material.

9. The method of claim 8, wherein calculating the first plurality of standoff heights and second plurality of standoff heights includes calculating the first plurality and second plurality of standoff heights based on capturing images of the substrate and the first and second semiconductor chips electrically connected thereto.

10. The method of claim 8, wherein calculating the first plurality of standoff heights and second plurality of standoff heights includes calculating the first plurality and second plurality of standoff heights based on a 3-dimensional x-ray of the substrate and the first and second semiconductor chips electrically connected thereto.

11. The method of claim 8, wherein calculating the first plurality of standoff heights and second plurality of standoff heights includes calculating the first plurality and second plurality of standoff heights based on laser height sensing.

12. The method of claim 8, wherein calculating the first plurality of standoff heights and second plurality of standoff heights includes calculating the first plurality and second plurality of standoff heights based on a 3-dimensional automated optical inspection of the substrate and the first and second semiconductor chips electrically connected thereto.

13. A system for dispensing an underfill material on a semiconductor device package including a substrate having at least one semiconductor chip electrically connected thereto by a plurality of solder joints, each semiconductor chip of the at least one semiconductor chip having a footprint defined by a length and width of the semiconductor chip, the system comprising:

one or more memory units each operable to store at least one program;

at least one processor communicatively coupled to the one or more memory units, in which the at least one program, when executed by the at least one processor, causes the at least one processor to perform the operations of:

calculating at least one standoff height between the substrate and the at least one semiconductor chip while the at least one semiconductor chip is electrically connected to the substrate by the plurality of solder joints;

determining, based on the calculated at least one standoff height, a volume of underfill material necessary to substantially fill a space between the substrate and the at least one semiconductor chip defined by the footprint of the at least one semiconductor chip and the calculated at least one standoff height; and causing an underfill dispensing device to dispense the determined volume of underfill material on the substrate such that the space between the substrate and the at least one semiconductor chip is substantially filled.

14. The system of claim 13, further comprising:
an image capture device communicatively coupled to the at least one processor, the image capture device configured to capture an image of the substrate and semiconductor chip electrically connected thereto,
wherein the calculating the at least one standoff height is based on the image captured by the image capture device.

15. The system of claim 13, further comprising:
a 3-dimensional x-ray device communicatively coupled to the at least one processor, the 3-dimensional x-ray device configured to generate a 3-dimensional x-ray of the substrate and semiconductor chip electrically connected thereto,
wherein the calculating the at least one standoff height is based on the 3-dimensional x-ray generated by the 3-dimensional x-ray device.

16. The system of claim 13, further comprising:
a laser height sensing device communicatively coupled to the at least one processor, the laser height sensing device configured to calculate the at least one standoff height in response to a request from the at least one processor to calculate the at least one standoff height.

17. The system of claim 13, further comprising:
a 3-dimensional automated optical inspection device communicatively coupled to the at least one processor, the 3-dimensional automated optical inspection device configured to perform a 3-dimensional automated optical inspection of the substrate and semiconductor chip electrically connected thereto,
wherein the calculating the at least one standoff height is based on the performed 3-dimensional automated optical inspection.

* * * * *